United States Patent [19]
McQueen

[11] Patent Number: 5,364,814
[45] Date of Patent: Nov. 15, 1994

[54] GERMANIUM IMPLANTED STACKED CAPACITOR CELL

[75] Inventor: Mark A. McQueen, Boise, Id.

[73] Assignee: Micron Technology, Inc., Boise, Id.

[21] Appl. No.: 132,682

[22] Filed: Oct. 6, 1993

Related U.S. Application Data

[63] Continuation of Ser. No. 911,411, Jul. 9, 1992, abandoned.

[51] Int. Cl.$^5$ .................. H01L 21/70; H01L 27/00
[52] U.S. Cl. ............................. 437/52; 437/60; 437/919; 437/24
[58] Field of Search ............. 437/919, 60, 52, 24

[56] References Cited

U.S. PATENT DOCUMENTS

| | | | |
|---|---|---|---|
| 4,329,706 | 5/1982 | Crowder et al. | |
| 4,837,173 | 6/1989 | Alvis et al. | 437/24 |
| 4,951,175 | 8/1990 | Kurosawa et al. | 437/52 |
| 5,028,990 | 7/1991 | Kotaki et al. | 357/23.6 |
| 5,142,639 | 8/1992 | Kohyama et al. | 357/23.6 |
| 5,145,794 | 9/1992 | Kase et al. | 437/24 |

OTHER PUBLICATIONS

"Improved MOSFET Short-Channel Device Using Germanium Implantation", J. R. Pfiester, M. E. Law, and R. W. Dutton, IEEE, 1988.

*Primary Examiner*—Olik Chaudhuri
*Assistant Examiner*—H. Jey Tsai
*Attorney, Agent, or Firm*—David J. Paul

[57] ABSTRACT

A method of fabricating a stacked capacitor memory cell having a reduced leakage storage node includes the steps of providing a P-type substrate, forming wordlines on a thin gate oxide layer and a field oxide layer, and forming a first conformal TEOS oxide layer. The P-type substrate is doped with an N-type dopant directly through the first TEOS oxide layer to form two N-type diffused areas, which are the first and second current terminals of the memory cell access transistor. A second conformal TEOS oxide layer is deposited. The oxide layers are etched to form a buried contact window above the storage node of the memory cell. The exposed portion of the N-type diffused area forming the memory cell storage node is subsequently doped with germanium through the buried contact window to suppress any outdiffusion due to the doping of subsequently formed layers, such as the first plate of a stacked polysilicon capacitor. The first plate of the stacked capacitor is formed above the buried contact window, and is in contact with the germanium and N-type dopant diffused area. Although the first plate of the stacked capacitor is heavily doped, outdiffusion is limited by the action of the germanium implant.

22 Claims, 3 Drawing Sheets

GERMANIUM IMPLANTED STACKED CAPACITOR CELL

This application is a continuation of application Ser. No. 07/911,411 filed Jul. 9, 1992, now abandoned.

BACKGROUND OF THE INVENTION

This invention relates generally to stacked capacitor memory cells, and more particularly to a method of reducing the storage node leakage current in the memory cell.

A partially formed stacked capacitor memory cell is shown in FIG. 1. In pertinent part, the partially formed memory cell includes a P-type substrate 10, polysilicon wordlines 12A and 12B, a first TEOS oxide layer 14A, a thick field oxide layer 16, and a channel stop layer 18. The polysilicon wordline 12A is insulated from the P-type substrate by a thin oxide layer 13. The first TEOS oxide layer 14A is about 1000 Angstroms thick. Referring now to FIG. 2, the partially formed memory cell is blanket implanted with a light N-type dopant implant of phosphorous to form the source and drain of the memory cell access transistor. The phosphorous dopant is implanted with a density of between 1.5 and $2.0 \times 10^{13}/cm^2$. N-type diffusions 20 and 28 can function as both drain and source of the memory cell access transistor, depending upon whether the memory cell is being read from or written to. Diffusion 20 is subsequently referred to as the "storage node" and diffusion 28 is subsequently referred to as the "bitline contact". Referring now to FIG. 3, a second TEOS oxide layer 14B is deposited on top of the first TEOS oxide layer 14A. The second TEOS oxide layer has a thickness of about 2000 Angstroms.

Referring now to FIG. 4, the first and second TEOS layers 14A and 14B, along with a patterned photoresist layer 15 are etched between wordline 12A and the field oxide layer 16 to form a buried contact window 17. The photoresist layer 15 is stripped and the first and second oxide layers are shown as a single oxide layer 14 in FIG. 5. Referring now to FIG. 6, the first polysilicon plate 22 of a stacked capacitor is formed and electrically contacts N-type storage node 20. The first plate 22 of the stacked capacitor is heavily doped with an N-type dopant to form an ohmic contact to storage node 20. The polysilicon storage node capacitor plate 22 is ideally highly doped to a level that allows for good conduction. A typical sheet resistivity for good conduction is in the range of 125 to 300 ohms per square, or less. During subsequent processing steps, however, the depth and lateral extent of storage node 20 increases, primarily because of outdiffusion from the heavily doped capacitor plate 22. Drain 20 expands from about 0.3 microns to drain 20', which is about 0.5 microns or more. FIG. 7 shows the second capacitor plate 26 and dielectric oxide/nitride/oxide ("ONO") layer 24.

Outdiffusion of storage node 20 has a negative impact upon the performance of the memory cell. Normal process and masking variations, as well as the dimensions of the outdiffused drain 20', cause dopants to migrate close to the bitline contact 28 and create a leaky memory cell access transistor. Ideally, when the access transistor is off, it forms a high impedance series resistance and the memory cell has no leakage current. A leaky access transistor, however, bleeds charge off of the storage node 20, effectively diminishing the effective size of the memory cell storage capacitor.

What is desired is a method for minimizing the leakage current from the storage node of a stacked capacitor memory cell due to outdiffusion from a highly doped stacked capacitor plate into the storage node.

SUMMARY OF THE INVENTION

It is, therefore, a principal object of the invention to reduce the leakage current from the storage node of a stacked-capacitor memory cell.

It is an advantage of the present invention that the improvement in leakage current can be accomplished without an additional masking step.

According to the present invention, a method of fabricating a stacked capacitor memory cell having a reduced leakage storage node includes the steps of providing a P-type substrate, forming wordlines on a thin gate oxide layer and a field oxide layer, and forming a first conformal TEOS oxide layer. The P-type substrate is doped with an N-type dopant such as phosphorous directly through the first TEOS oxide layer to form two N-type diffused areas, which are the first and second current terminals of the memory cell access transistor. A second conformal TEOS oxide layer is deposited. The oxide layers are etched to form a buried contact window above the storage node of the memory cell. The exposed portion of the N-type diffused area forming the memory cell storage node is subsequently doped with germanium through the buried contact window to suppress any outdiffusion due to the doping of subsequently formed layers, such as the first plate of a stacked polysilicon capacitor. The first plate of the stacked capacitor is formed above the buried contact window, and is in contact with the germanium and N-type dopant diffused area. Although the first plate of the stacked capacitor is heavily doped, outdiffusion is limited by the action of the germanium implant. A dielectric layer and second capacitor plate are subsequently formed to complete the stacked capacitor.

Germanium may be introduced into the memory cell storage node by either diffusion or ion implantation, resulting in a final germanium doping density at the surface of the P-type substrate between $10^{19}$ cm$^{-3}$ and $10^{20}$ cm$^{-3}$. If ion implantation is used, it is desirable that a dose of between $2 \times 10^{15}$ cm$^{-2}$ and $5 \times 10^{15}$ cm$^{-2}$ at an energy of between 100 and 150 KeV be used.

The foregoing and other objects, features and advantages of the invention will become more readily apparent from the following detailed description of a preferred embodiment of the invention which proceeds with reference to the accompanying drawings.

DETAILED DESCRIPTION

Figure 1:
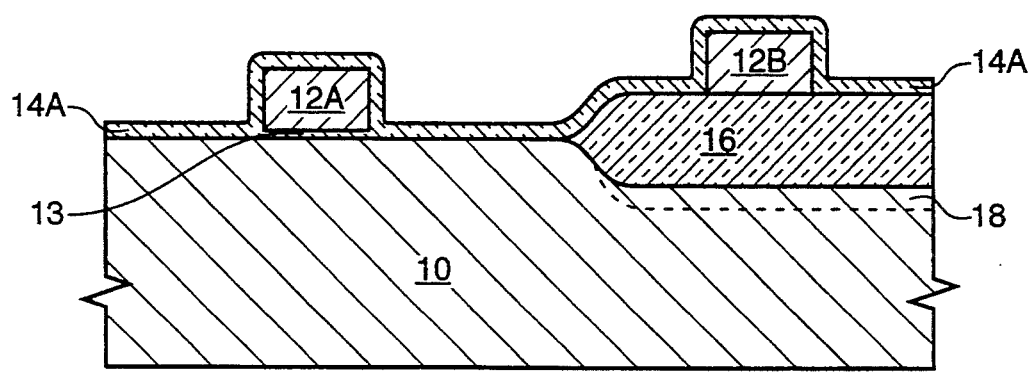
FIGS. 1–7 are cross-sectional views of the stacked capacitor memory cell at various points during the fabrication process according to the present invention.
Figure 2:
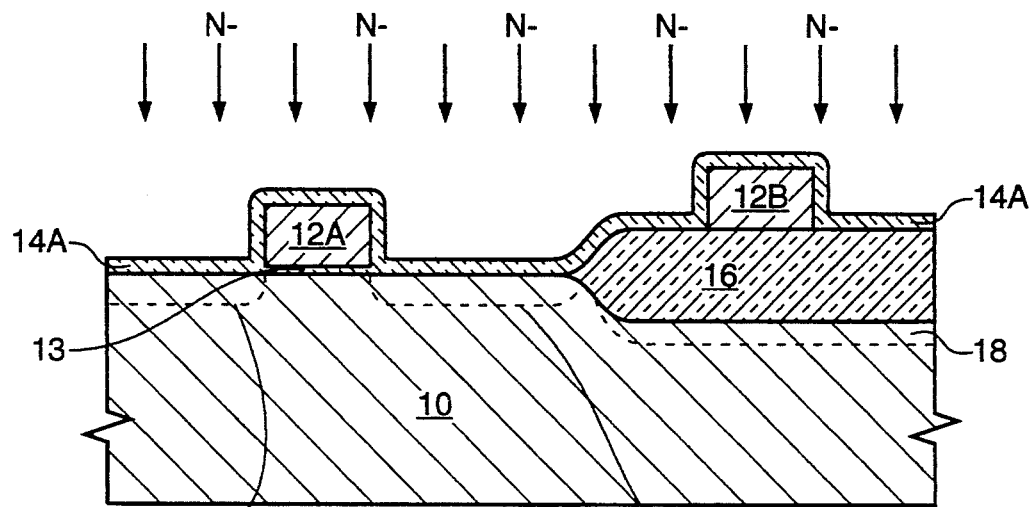
Figure 3:
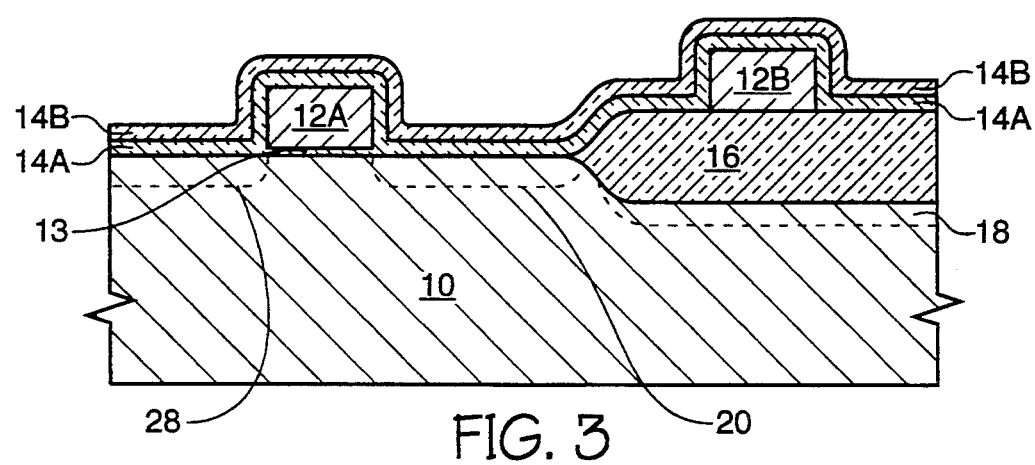

Referring now to FIG. 1 in greater detail, a partially formed stacked capacitor memory cell is shown having a P-type substrate 10, polysilicon wordlines 12A and 12B, a thin gate oxide layer 13, a first TEOS oxide layer 14A, a field oxide layer 16, and a channel stop layer 18. Initially, a thin gate oxide layer 13 is grown on the entire surface of the P-type substrate 10. A subsequent silicon nitride ($Si_3N_4$) layer (not shown) is formed on top of the thin gate oxide layer 13. The silicon nitride layer is patterned and removed in those areas where a field oxide is required to isolate a memory cell from adjacent memory cells. Before the field oxide layer 16 is grown, the area between adjacent memory cells is implanted with a P-type dopant such as boron to form a highly doped channel stop layer 18. The field oxide layer 16 is then formed. A typical birds-beak feature is formed near the edge of the silicon nitride layer. After the thick field oxide layer 16 is formed, the patterned silicon nitride layer is completely removed. Polysilicon and silicide (such as tungsten silicide, $WSi_x$) layers are deposited over the surface of the memory cell, patterned and etched, to form the wordline features 12A and 12B. A wordline is the gate connection to the memory cell access transistor. In the embodiment of FIG. 1, the memory cells are laid out such that a portion of the wordline pattern is over the thin gate oxide layer 13 to form the actual gate of the access transistor, and another portion is formed over the thick field oxide layer 16. Once the wordline pattern is formed, a first TEOS oxide layer 14A of about 1000 Angstroms thick is formed over the surface of the memory cell. N-type lightly doped regions 20 and 28, which are the memory cell access transistor drain and source, are implanted directly through TEOS layer 14A. The lightly doped region 20 is best seen in FIG. 2, and is often referred to as the "storage node" of the memory cell, since this node is coupled to the memory cell capacitor. The lightly doped region 28 is also shown in FIG. 2, and is often referred to as the "bitline contact" of the memory cell. The diffusion area 20 is normally about 0.3 microns deep. Referring now to FIG. 3, after regions 20 and 28 are formed, a second TEOS layer 14B is formed that is about 2000 Angstroms thick.

Figure 4:
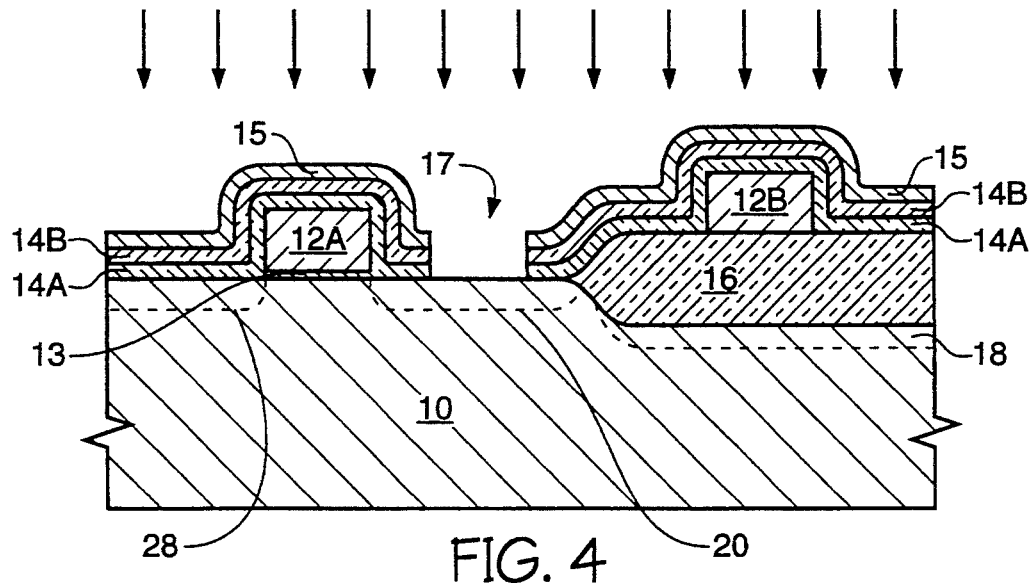
Figure 5:
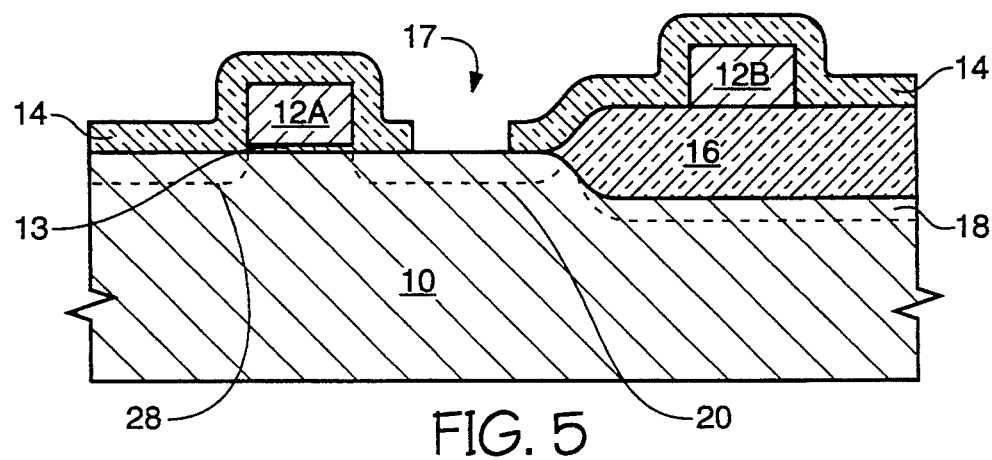

FIG. 4 shows that the first and second TEOS layers 14A and 14B, as well as photoresist layer 15, are patterned and etched. The photoresist layer 15 receives the pattern for forming the contact window 17, and only the exposed areas are etched. Once the contact window 17 is etched, but before the photoresist layer 15 is removed, the entire surface of the memory cell is doped with germanium. Only the N-type doped region 20 is actually further doped with germanium through the buried contact window 17. The photoresist layer 15 absorbs the germanium in all other areas and therefore germanium dopant does not reach the substrate 10 or other diffused areas. The implantation of germanium is self-aligned to the buried contact window, which is necessary for the doping of drain 20. An additional masking step is therefore not required for the germanium doping step. The photoresist layer 15 is removed in FIG. 5, and the first and second TEOS oxide layer 14A and 14B are shown as a single oxide layer 14 for clarity.

The germanium dopant may be introduced into the storage node by either diffusion or ion implantation, resulting in a final germanium doping density at the surface of the P-type substrate between $10^{19}$ cm$^{-3}$ and $10^{20}$ cm$^{-3}$. If ion implantation is used, it is desirable that a dose of between $2 \times 10^{15}$ cm$^{-2}$ and $5 \times 10^{15}$ cm$^{-2}$ at an energy of between 100 and 150 KeV be used.

Figure 6:
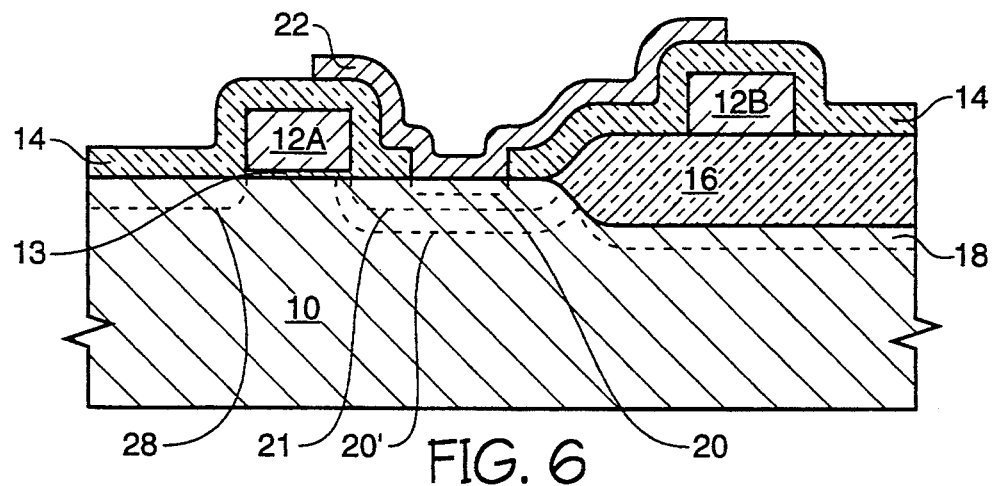

Referring now to FIG. 6, the germanium doping step is highly desirable since it tends to suppress any enhancement in dopant outdiffusion from the N-type dopants in the polysilicon storage plate 22 of the memory cell capacitor. Thus, the lightly doped storage node 20 remains at a thickness of about 0.3 microns, and does not extend out to about 0.5 microns or more as in the prior art drain diffusion 20'. The germanium interface boundary 21 is also shown in FIG. 6. Germanium is not a dopant, but rather a semiconductor and therefore does not form a junction at interface boundary 21. The germanium outdiffuses into the P-type substrate and reduces the number of point defects in the silicon as it outdiffuses, which slows phosphorous outdiffusion. Although the germanium implant does not completely block all outdiffusion from capacitor plate 22, the outdiffusion is limited to the depth of storage node 20, about 0.3 microns, and therefore does not contribute to increasing leakage current at the storage node of the memory cell.

Figure 7:
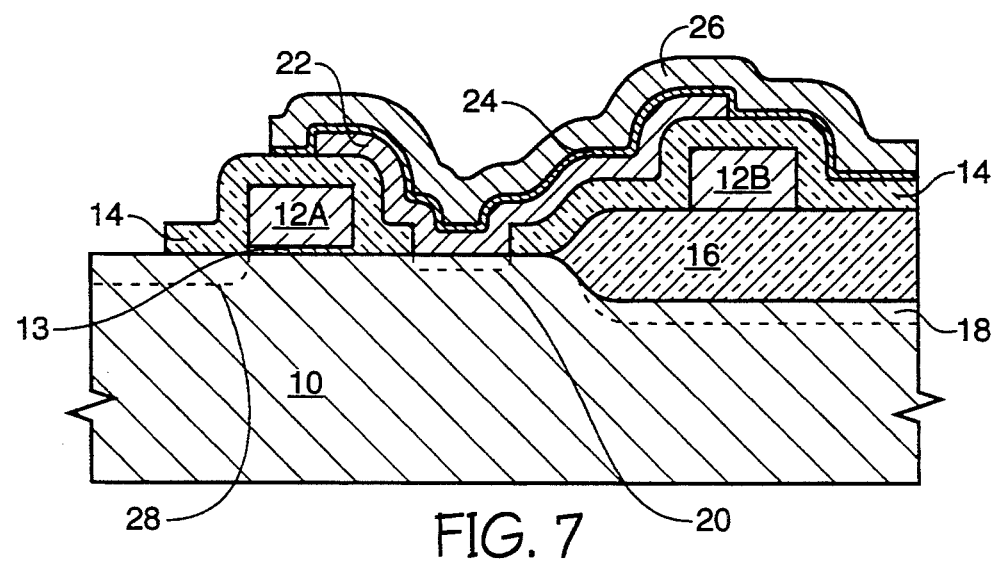

Referring now to FIG. 7, the first plate 22 of the stacked capacitor is formed above the buried contact window 17, and forms an ohmic electrical contact with the germanium and N-type doped storage node 20. The first capacitor plate 22 is formed from a patterned and etched conformal layer of polysilicon. The first plate 22 of the stacked capacitor is subsequently doped with phosphorous through implantation or diffusion to form a highly conductive capacitor plate to a sheet resistance of between 125 and 300 ohms per square. A thin dielectric layer 24 and a second polysilicon layer 26 are subsequently formed over the entire memory cell surface. The dielectric 24 and second polysilicon layers 26 are patterned and etched together to complete the capacitor dielectric layer and second capacitor plate. The memory cell can be completed in the normal manner by forming a planarized BPSG layer and etching a contact to the bitline contact node 28.

Having described and illustrated the principles of the invention in a preferred embodiment thereof, it is apparent to those skilled in the art that the invention can be modified in arrangement and detail without departing from such principles. I therefore claim all modifications and variation coming within the spirit and scope of the following claims.

I claim:

1. A method of fabricating a stacked capacitor memory cell comprising the steps of:
   (a) providing a P-type substrate;
   (b) forming a word line that is insulated from the substrate by a thin oxide layer;
   (c) forming a thick field oxide layer spaced laterally from the word line;
   (d) forming a conformal oxide layer over the P-type substrate, word line and thick field oxide layer;
   (e) doping the P-type substrate between the word line and the field oxide through the conformal oxide layer with an N-type dopant to form an N-type diffused region in the P-type substrate;
   (f) etching a buried contact window in the conformal oxide layer to expose the N-type diffused region between the word line and the thick field oxide layer;
   (g) doping the exposed N-type diffused region with germanium through the buried contact window and to a location bordering the outside edges of the N-type diffused region;
   (h) forming a first plate of a capacitor, made of heavily phosphorus doped polysilicon, above the buried contact window in contact with the N-type diffused region; and
   (i) diffusing phosphorus, from the more heavily phosphorus doped polysilicon that is in contact with the N-type diffused region, to the lighter phosphorus concentration located in the substrate, and having the diffused phosphorus out-diffusion no further than the outer boundary of the N-type diffused region, wherein the germanium atoms restrict the distance the phosphorus can travel into the substrate.

2. The method of claim 1 in which the step of doping the exposed N-type diffused region with germanium results in a final germanium doping density at the surface of the N-type region between $10^{19}$ cm$^{-3}$ and $10^{20}$ cm$^{-3}$.

3. The method of claim 1 in which the step of doping the exposed N-type diffused region with germanium comprises the step of blanket implanting germanium over the entire surface of the memory cell.

4. The method of claim 1 in which the step of doping the exposed N-type diffused region with germanium comprises the step of implanting germanium at a dose of between $2 \times 10^{15}$ cm$^{-2}$ and $5 \times 10^{15}$ cm$^{-2}$ at an energy of between 100 and 150 KeV.

5. The method of claim 1 in which the step of doping the exposed N-type diffused region with germanium comprises the step of diffusing germanium through the buried contact window.

6. The method of claim 1 in which the step of doping the first plate of the stacked capacitor comprises doping the first plate to a sheet resistance of between 125 and 300 ohms per square.

7. The method of claim 1 further comprising the steps of:
forming a dielectric layer atop the first plate; and
forming a second plate atop the dielectric layer to complete a stacked capacitor above the buried contact window.

8. A method of fabricating a stacked capacitor memory cell comprising the steps of:
(a) providing a P-type substrate;
(b) growing a gate oxide layer on a portion of the P-type substrate;
(c) forming a field oxide layer on a portion of the P-type substrate to isolate the memory cell;
(d) forming a polysilicon layer;
(e) etching the polysilicon layer to form a word line above the gate oxide layer, laterally spaced from the field oxide layer;
(f) forming a TEOS oxide layer over the entire surface of the memory cell;
(g) forming an N-type diffusion region by doping the exposed portion of the P-type substrate with an N-type dopant through the TEOS oxide layer located between the field oxide layer and the word line;
(h) etching the TEOS oxide layer between the word line and the field oxide to form a buried contact window in the TEOS oxide layer to expose the N-type diffused region;
(i) doping the exposed N-type diffused region with germanium through the buried contact window with a concentration of germanium sufficient to prevent outdiffusion of N-type dopant or diffusion beyond a junction depth of the N-type region
(j) forming a first plate of a stacked capacitor, made of heavily phosphorus doped polysilicon, above the buried contact window in contact with the N-type diffused region;
(k) diffusing phosphorus, from the more heavily phosphorus doped polysilicon that is in contact with the N-type diffused region, to the lighter phosphorus concentration located in the substrate, and having the diffused phosphorus out-diffuse no further that the outer boundary of the N-type diffused region, wherein the germanium atoms restrict the distance the phosphorus can travel into the substrate;
(l) forming a dielectric layer and a second plate to complete a stacked capacitor above the buried contact window.

9. The method of claim 8 in which the step of doping the exposed N-type diffused region with germanium results in a final germanium doping density at the surface of the N-type region between $10^{19}$ cm$^{-3}$ and $10^{20}$ cm$^{-3}$.

10. The method of claim 8 in which the step of doping the exposed N-type diffused region with germanium comprises the step of blanket implanting germanium over the entire surface of the memory cell.

11. The method of claim 8 in which the step of doping the exposed N-type diffused region with germanium comprises the step of implanting germanium at a dose of between $2 \times 10^{15}$ cm$^{-2}$ and $5 \times 10^{15}$ cm$^{-2}$ at an energy of between 100 and 150 KeV.

12. A method of forming a stacked capacitor diffusion region, comprising:
providing a stacked capacitor including:
a) a silicon substrate;
b) an access transistor, located above the substrate;
c) a field oxide spaced away from the access transistor;
d) laying a first conformal TEOS layer over all parts of the provided stacked capacitor;
e) implanting an N- type dopant through the TEOS layer at a location between the access transistor and the field oxide spaced away from the access transistor;
f) laying a second conformal TEOS layer over all parts of the provided stacked capacitor;
g) etching away a window located between the accessed transistor and the field oxide forming a storage node;
h) implanting germanium, into the storage node, and to a location bordering the outside edges of the N-type dopant implant;
i) laying a conformal layer of heavily phosphorous doped polysilicon over the access transistor and in contact with the storage node;
j) diffusing phosphorus, from the more heavy concentration from the polysilicon that is in contact with the storage node, to the lighter phosphorus concentration located in the substrate, and having the diffused phosphorus out-diffuse no further than the outer boundary of the N-type dopant implant, wherein the germanium atoms restrict the distance the phosphorus can travel into the substrate.

13. The method of claim 12 in which the step of implanting germanium into the storage node results in a final germanium doping density at the surface of the storage node between $10^{19}$ and $10^{20}$ per cm cubed.

14. The method of claim 13 in which the step of doping the storage node with germanium comprises the step of blanket implanting germanium over the entire surface of the memory cell.

15. A method of fabricating a capacitor cell connected to an underlying substrate implant region said implant region having boundaries, said method comprising the steps of:
a) forming gate connections over a supporting substrate;

b) implanting a first N-type material into the substrate located on both sides of the gate connections, thus forming first and second implant regions that are self aligned to the gate connections edges;

c) implanting germanium (Ge) into only the first implant regions, and diffusing the Ge to substantially align with the first implant region edges;

d) depositing first stacked cell capacitor plate, having a heavy concentration of N-type material, located above and in contact with only the first implant regions; and e) diffusing the N-type material from the first stacked cell capacitor plate into the first implant region so that the diffused N-type material will out-diffuse no further than the boundary of the outside edges of the first implant region, wherein the germanium atoms restrict the distance the N-type material can travel into the substrate.

16. The method of claim 15 in which the step of doping the N-type diffused region with germanium results in a final germanium doping density at the surface of the N-type region between $10^{19}$ cm$^{-3}$ and $10^{20}$ cm$^{-3}$.

17. The method of claim 15 in which the step of doping the N-type diffused region with germanium comprises the step of blanket implanting germanium over the entire surface of the memory cell.

18. The method of claim 15 in which the step of doping the N-type diffused region with germanium comprises the step of implanting germanium at a dose of between $2 \times 10^{15}$ cm$^{-2}$ and $5 \times 10^{15}$ cm$^{-2}$ at an energy of between 100 and 150 KeV.

19. The method of claim 15 in which the step of doping the N-type diffused region with germanium comprises the step of diffusing germanium through the buried contact window.

20. The method of claim 15 in which the step of forming a first plate of the stacked capacitor comprises the steps of: forming a polysilicon layer, a portion of which covers the buried contact window; and patterning the polysilicon layer.

21. The method of claim 15 in which the step of doping the first plate of the stacked capacitor comprises doping the first plate to a sheet resistance of between 125 and 300 ohms per square.

22. The method of claim 15 further comprising the steps of:

forming a dielectric layer atop the first plate; and forming a second plate atop the dielectric layer to complete a stacked capacitor above the buried contact window.

* * * * *